United States Patent
Grubeck

(10) Patent No.: US 9,136,880 B2
(45) Date of Patent: Sep. 15, 2015

(54) METHOD FOR STOPPING ITERATION IN AN ITERATIVE TURBO DECODER AND AN ITERATIVE TURBO DECODER

(75) Inventor: Hans Grubeck, Kista (SE)

(73) Assignee: ZTE WISTRON TELECOM AB, Kista (SE)

(*) Notice: Subject to any disclaimer, the term of this patent is extended or adjusted under 35 U.S.C. 154(b) by 274 days.

(21) Appl. No.: 13/823,346

(22) PCT Filed: Jan. 5, 2011

(86) PCT No.: PCT/SE2011/050007
§ 371 (c)(1),
(2), (4) Date: May 7, 2013

(87) PCT Pub. No.: WO2012/093956
PCT Pub. Date: Jul. 12, 2012

(65) Prior Publication Data
US 2013/0219241 A1    Aug. 22, 2013

(51) Int. Cl.
H03M 13/00 (2006.01)
H03M 13/29 (2006.01)
H04L 1/00 (2006.01)
H03M 13/09 (2006.01)

(52) U.S. Cl.
CPC ...... *H03M 13/2933* (2013.01); *H03M 13/2975* (2013.01); *H04L 1/005* (2013.01); *H04L 1/0066* (2013.01); *H03M 13/09* (2013.01)

(58) Field of Classification Search
None
See application file for complete search history.

(56) References Cited

U.S. PATENT DOCUMENTS

2002/0174401 A1* 11/2002 Wang et al. .................. 714/786
2007/0124657 A1*  5/2007 Orio ............................ 714/794
2007/0180351 A1*  8/2007 Orio ............................ 714/786

FOREIGN PATENT DOCUMENTS

| JP | 2002100995 A | 4/2002 |
| JP | 2007036683 A | 2/2007 |
| JP | 2007194684 A | 8/2007 |

OTHER PUBLICATIONS

Author: Zhongfeng Wang, Yuping Zhang and Keshab K. Parhi; Title: Study of Early Stopping Criteria for Turbo Decoding and Their Applications in WCDMA Systems; Publisher: IEEE 142440469X/06; Date: 2006.*

Fengqin Zhai and Ivan J. Fair, "New Error Detection Techniques and Stopping Criteria for Turbo Decoding," Proceedings of the 2000 IEEE Canadian Conference on Electrical and Computer Engineering, Halifax, Canada, pp. 58-62, May 7-10, 2000.

* cited by examiner

*Primary Examiner* — April Y Blair
*Assistant Examiner* — Thien D Nguyen
(74) *Attorney, Agent, or Firm* — Pillsbury Winthrop Shaw Pittman LLP

(57) ABSTRACT

The present document discloses a method for stopping iteration in an iterative Turbo decoder and an iterative Turbo decoder. Hard decisions from the two convolutional decoders of the iterative Turbo decoder are used simultaneously to determining when to stop the iteration in the iterative Turbo decoder.

13 Claims, 5 Drawing Sheets

METHOD FOR STOPPING ITERATION IN AN ITERATIVE TURBO DECODER AND AN ITERATIVE TURBO DECODER

CROSS-REFERENCE TO PRIOR APPLICATIONS

This application is a National Stage of PCT/SE 2011/050007, filed Jan. 5, 2011, and designating the United States (published in English on Jul. 12, 2012, as WO 2012/093956 A1), hereby expressly incorporated by reference in its entirety and assigned to the assignee hereof.

TECHNICAL FIELD

The present document relates to communication technology, and especially to a method for stopping iterations in an iterative Turbo decoder and an iterative Turbo decoder in communication systems.

BACKGROUND

In cellular systems of today, Turbo coding is used for channel coding. This technique is used in both uplink and downlink transmission. In the receiver in the base station or in the mobile terminal, a Turbo decoder is implemented to inverse the Turbo encoding operation on the transmitted data.

The Turbo decoder is typically implemented as an iterative decoder. To be able to determine if the data has been decoded correctly, Cyclic Redundancy Check (CRC) bits are added to the transmitted data bits. When the CRC check indicates that the received data bits are correctly decoded, the Turbo decoder iterations stops. If the signal quality is high, the number of required iterations is likely small. But when the signal quality is low, the number of required iterations can be high. However, if the signal quality is too low, the decoder will not be able to decode the coded bits. In such a case the CRC check will never indicate a decoding success and there is no obvious way of determining when to stop the iteration process. One way of solving this problem is to have a fixed maximum number of iterations. This solution can also be used to avoid the extra computation due to the CRC checks between all iterations, and instead only one final CRC check is performed after the iteration procedure has terminated.

However, the decoding part by using the solution having a fixed maximum number of iterations is considered a complex hardware or software unit and it requires a large part of these resources. Hence, it is desired to reduce the number of iterations in order to reduce the complexity. However, this reduction will have an impact on the decoding performance. Therefore, efficient methods to stop the decoding iterations are desired.

DISCLOSURE OF INVENTION

The purpose of the document is to provide a solution to stop iteration in an iterative Turbo decoder to save hardware resources in the base station or mobile, and to improve the overall system performance.

An object of the present document is to provide a method for stopping iteration in an iterative Turbo decoder. The method comprises:
obtaining a first hard decision $H(1, j, k)$ and a second hard decision $H(2, j, k)$ for systematic bit number k at iteration step $j=1$;
wherein $k=1, 2, \ldots, N$, and N is the number of systematic bits;

wherein $H(1, j, k)$ is obtained by performing hard decision on a first log-likelihood ratio output from a first convolutional decoder of the iterative Turbo decoder for systematic bit number k at iteration step $j=1$, and $H(2, j, k)$ is obtained by performing hard decision on a deinterleaved second log-likelihood ratio for systematic bit number k at iteration step $j=1$, the deinterleaved second log-likelihood ratio is obtained by deinterleaving a second log-likelihood ratio output from a second convolutional decoder of the iterative Turbo decoder;
determining whether $A(j)$ is zero at $j=1$, wherein $A(j)$ is calculated by:

$$A(j) = \sum_{k=1}^{N} |H(1, j, k) - H(2, j, k)|,$$

where $j=1$; and
stopping the iteration if $A(j)$ is zero at $j=1$.

Optionally, in the determining step of $A(j)$ at $j=1$, if $A(j)$ is nonzero at $j=1$, the method further comprises:
obtaining a first hard decision $H(1, j, k)$ and a second hard decision $H(2, j, k)$ for systematic bit number k at iteration step h, wherein $j=2, 3, \ldots$;
wherein $H(1, j, k)$ is obtained by performing hard decision on a first log-likelihood ratio output from the first convolutional decoder of the iterative Turbo decoder for systematic bit number k at iteration step j, and $H(2, j, k)$ is obtained by performing hard decision on a deinterleaved second log-likelihood ratio for systematic bit number k at iteration step j, the deinterleaved second log-likelihood ratio is obtained by deinterleaving a second log-likelihood ratio output from the second convolutional decoder of the iterative Turbo decoder;
determining whether $B(j)$ or $C(j)$ is zero at $j>1$,
wherein $B(j)$ is calculated by:

$$B(j) = \sum_{k=1}^{N} |H(2, j-1, k) - H(1, j, k)|,$$

where $j=2, 3, \ldots$,
wherein $C(j)$ is calculated by:

$$C(j) = \sum_{k=1}^{N} |H(1, j-1, k) - H(1, j, k)|,$$

where $j=2, 3, \ldots$,
and
stopping the iteration if $B(j)$ or $C(j)$ is zero.

Optionally, in the determining step of $B(j)$ and $C(j)$ at $j>1$, if both $B(j)$ and $C(j)$ are nonzero at $j>1$, the method further comprises:
determining whether $A(j)$ or $D(j)$ is zero at $j>1$, or $a(j)>0$ and $N_a(j)=M_a$ at $j>1$,
wherein $A(j)$ is calculated by:

$$A(j) = \sum_{k=1}^{N} |H(1, j, k) - H(2, j, k)|,$$

where j=2, 3, . . . ,
  wherein D(j) is calculated by:

$$D(j) = \sum_{k=1}^{N} |H(2, j-1, k) - H(2, j, k)|,$$

where j=2, 3, . . . ,
  wherein a(j) is calculated by: a(j)=A(j)−A(j−1), where j=2, 3, . . . ;
  wherein $M_a$ is any one among 0, 1, 2, . . . , 9;
  wherein $N_a(j)$ is the number of ascending ordered disjunct connected sets of j:s preceding j, where a(j) for the last element in each set is negative, and a(j) for the preceding elements of the set are zero or positive and includes at least one positive value;
  and
  stopping the iteration if A(j) or D(j) is zero, or a(j)>0 and $N_a(j)=M_a$.
  Optionally, in the step of determining whether A(j) or D(j) is zero at j>1, or a(j)>0 and $N_a(j)=M_a$ at j>1, if both A(j) and D(j) are nonzero at j>1 and a(j)<0 or $N_a(j) \neq M_a$ at j>1, the method further comprises:
  determining whether b(j)>0 and $N_b(j)=M_b$ at j>2 or c(j)>0 and $N_c(j)=M_c$ at j>2,
    wherein b(j) is calculated by: b(j)=B(j)−B(j−1), where j=3, 4, . . . ;
    wherein $M_b$ is any one among 0, 1, 2, . . . , 9;
    wherein $N_b(j)$ is the number of ascending ordered disjunct connected sets of j:s preceding j, where b(j) for the last element in each set is negative, and b(j) for the preceding elements of the set are zero or positive and includes at least one positive value;
    wherein c(j) is calculated by: c(j)=C(j)−C(j−1), where j=3, 4, . . . ;
    wherein $M_c$ is any one among 0, 1, 2, . . . , 9;
    wherein $N_c(j)$ is the number of ascending ordered disjunct connected sets of j:s preceding j, where c(j) for the last element in each set is negative, and c(j) for the preceding elements of the set are zero or positive and includes at least one positive value;
    and
    stopping the iteration if b(j)>0 and $N_b(j)=M_b$, or c(j)>0 and $N_c(j)=M_c$.
  Optionally, in the step of determining whether b(j)>0 and $N_b(j)=M_b$ at j>2 or c(j)>0 and $N_c(j)=M_c$ at j>2, if b(j)≤0 or $N_b(j) \neq M_b$, and c(j)≤0 or $N_c(j) \neq M_c$, the method further comprises:
    determining whether A(j) or D(j) is zero at j>2, or a(j)>0 and $N_a(j)=M_a$ at j>2, or d(j)>0 and $N_d(i)=M_d$ at j>2
      wherein A(j) is calculated by:

$$A(j) = \sum_{k=1}^{N} |H(1, j, k) - H(2, j, k)|,$$

where j=3, 4, . . . ,
  wherein D(j) is calculated by:

$$D(j) = \sum_{k=1}^{N} |H(2, j-1, k) - H(2, j, k)|,$$

where j=3, 4, . . . ,
  wherein a(j) is calculated by: a(j)=A(j)−A(j−1), where j=3, 4, . . . ;
  wherein $M_a$ is any one among 0, 1, 2, . . . , 9;
  wherein $N_a(j)$ is the number of ascending ordered disjunct connected sets of j:s preceding j, where a(j) for the last element in each set is negative, and a(j) for the preceding elements of the set are zero or positive and includes at least one positive value;
  wherein d(j) is calculated by: d(j)=D(j)−D(j−1), where j=3, 4, . . . ;
  wherein $M_d$ is any one among 0, 1, 2, . . . , 9;
  wherein $N_a(j)$ is the number of ascending ordered disjunct connected sets of j:s preceding j, where d(j) for the last element in each set is negative, and d(j) for the preceding elements of the set are zero or positive and includes at least one positive value;
  and
  stopping the iteration if A(j) or D(j) is zero, or a(j)>0 and $N_a(j)=M_a$, or d(j)>0 and $N_a(j)=M_d$.
  Optionally, the iteration step j has a maximum number of $j_0$, if the iteration is not stopped at j<$j_0$, the method further comprises:
  stopping the iteration at j=$j_0$.
  Another object of the present document is to provide an iterative Turbo decoder. The iterative Turbo decoder comprises:
  a first hard decision device, the first hard decision device being configured to perform hard decision on a first log-likelihood ratio output from a first convolutional decoder and output a first hard decision H(1, j, k) for systematic bit number k at iteration step j; wherein k=1, 2, . . . , N, and N is the number of systematic bits, and j=1, 2, . . . ;
  a determining device, the determining device being configured to determine when to stop iteration in the iterative Turbo decoder based on the first hard decision H(1, j, k) and a second hard decision H(2, j, k), and output a stopping instruction to a decoding switch when determining a stopping criterion is met; and
  the decoding switch, the decoding switch being configured to stop iteration when receiving the stopping instruction from the determining device;
  wherein the second hard decision H(2, j, k) is output from a second hard decision device, the second hard decision device is configured to perform hard decision on a deinterleaved second log-likelihood ratio, the deinterleaved second log-likelihood ratio is obtained by deinterleaving a second log-likelihood ratio output from a second convolutional decoder,
  wherein the first convolutional decoder outputs a first extrinsic information that is then interleaved and output to the second convolutional decoder.
  Optionally, the determining device is configured to determine whether A(j) is zero at j=1, and outputs the stopping instruction to the decoding switch when determining that A(j) is zero at j=1, wherein A(j) is calculated by:

$$A(j) = \sum_{k=1}^{N} |H(1, j, k) - H(2, j, k)|,$$

where j=1.
  Optionally, the determining device is further configured to determine whether B(j) or C(j) is zero at j>1 if A(j) is nonzero at j=1, and output the stopping instruction to the decoding switch when determining that B(j) or C(j) is zero at j>1,
wherein B(j) is calculated by:

$$B(j) = \sum_{k=1}^{N} |H(2, j-1, k) - H(1, j, k)|,$$

where j=2, 3, . . . ,
wherein C(j) is calculated by:

$$C(j) = \sum_{k=1}^{N} |H(1, j-1, k) - H(1, j, k)|,$$

where j=2, 3, . . . , .

Optionally, the determining device is further configured to determine whether A(j) or D(j) is zero at j>1 or a(j)>0 and $N_a(j)=M_a$ at j>1 if both B(j) and C(j) are nonzero at j>1, and output the stopping instruction to the decoding switch when determining A(j) or D(j) is zero, or a(j)>0 and $N_a(j)=M_a$,
wherein A(j) is calculated by:

$$A(j) = \sum_{k=1}^{N} |H(1, j, k) - H(2, j, k)|,$$

where j=2, 3, . . . ,
wherein D(j) is calculated by:

$$D(j) = \sum_{k=1}^{N} |H(2, j-1, k) - H(2, j, k)|,$$

where j=2, 3, . . . ,
wherein a(j) is calculated by: a(j)=A(j)−A(j−1), where j=2, 3, . . . ,
wherein $M_a$ is any one among 0, 1, 2, . . . , 9;
wherein $N_a(j)$ is the number of ascending ordered disjunct connected sets of j:s preceding j, where a(j) for the last element in each set is negative, and a(j) for the preceding elements of the set are zero or positive and includes at least one positive value.

Optionally, the determining device is further configured to determine whether b(j)>0 and $N_b(j)=M_b$ at j>2 or c(j)>0 and $N_c(j)=M_c$ at j>2 if both A(j) and D(j) are nonzero at j>1 and a(j)≤0 or $N_a(j) \neq M_a$ at j>1, and output the stopping instruction to the decoding switch when determining b(j)>0 and $N_b(j)=M_b$, or c(j)>0 and $N_c(j)=M_c$;
wherein b(j) is calculated by: b(j)=B(j)−B(j−1), where j=3, 4, . . . ;
wherein $M_b$ is any one among 0, 1, 2, . . . , 9;
wherein $N_b(j)$ is the number of ascending ordered disjunct connected sets of j:s preceding j, where b(j) for the last element in each set is negative, and b(j) for the preceding elements of the set are zero or positive and includes at least one positive value;
wherein c(j) is calculated by: c(j)=C(j)−C(j−1), where j=3, 4, . . . ;
wherein $M_c$ is any one among 0, 1, 2, . . . , 9;
wherein $N_c(j)$ is the number of ascending ordered disjunct connected sets of j:s preceding j, where c(j) for the last element in each set is negative, and c(j) for the preceding elements of the set are zero or positive and includes at least one positive value.

Optionally, the determining device is further configured to determine whether A(j) or D(j) is zero at j>2, or a(j)>0 and $N_a(j)=M_a$ at j>2, or d(j)>0 and $N_d(j)=M_d$ at j>2 if b(j)≤0 or $N_b(j) \neq M_b$, and c(j)≤0 or $N_c(j) \neq M_c$, and output the stopping instruction to the decoding switch when determining A(j) or D(j) is zero, or a(j)>0 and $N_a(j)=M_a$, or d(j)>0 and $N_d(j)=M_d$;
wherein A(j) is calculated by:

$$A(j) = \sum_{k=1}^{N} |H(1, j, k) - H(2, j, k)|,$$

where j=3, 4, . . . ,
wherein D(j) is calculated by:

$$D(j) = \sum_{k=1}^{N} |H(2, j-1, k) - H(2, j, k)|,$$

where j=3, 4, . . . ,
wherein a(j) is calculated by: a(j)=A(j)−A(j−1), where j=3, 4, . . . ;
wherein $M_a$ is any one among 0, 1, 2, . . . , 9;
wherein $N_a(j)$ is the number of ascending ordered disjunct connected sets of j:s preceding j, where a(j) for the last element in each set is negative, and a(j) for the preceding elements of the set are zero or positive and includes at least one positive value;
wherein d(j) is calculated by: d(j)=D(j)−D(j−1), where j=3, 4, . . . ;
wherein $M_d$ is any one among 0, 1, 2, . . . , 9;
wherein $N_d(j)$ is the number of ascending ordered disjunct connected sets of j:s preceding j, where d(j) for the last element in each set is negative, and d(j) for the preceding elements of the set are zero or positive and includes at least one positive value.

Optionally, the iteration step j has a maximum number of $j_0$, the determining device is further configured to output the stopping instruction to the decoding switch at j=$j_0$.

By applying the method for stopping iteration in the iterative turbo decoder and the iterative Turbo decoder of the present document, the complexity of the hardware resources in the base station or mobile can be reduced. This reduction in complexity could relax the requirements on the hardware resource capabilities, which could lead to the possibility to use simpler and therefore, maybe cheaper hardware solutions. Alternatively, for a given hardware solution, the reduced utilization of the hardware resource could lead to the possibility to fill the freed resource with other functionality, which could in other ways improve the overall system performance.

DETAILED DESCRIPTION OF THE INVENTION

The main idea of the present document is to provide a solution for stopping iteration in an iterative Turbo decoder to avoid extra computation due to CRC check and to limit the number of iterations when decoding likely will fail after any number of iterations. Consider a radio network. The network comprises radio base stations, short base stations, and mobile terminals, short mobile terminals. The present document can either be implemented in the receiving parts of the base stations or in the receiving parts of the mobile terminals. In accordance with the solution of the present document, hardware resources in the base station or mobile can be saved, and the overall system performance can be improved.

Figure 1:
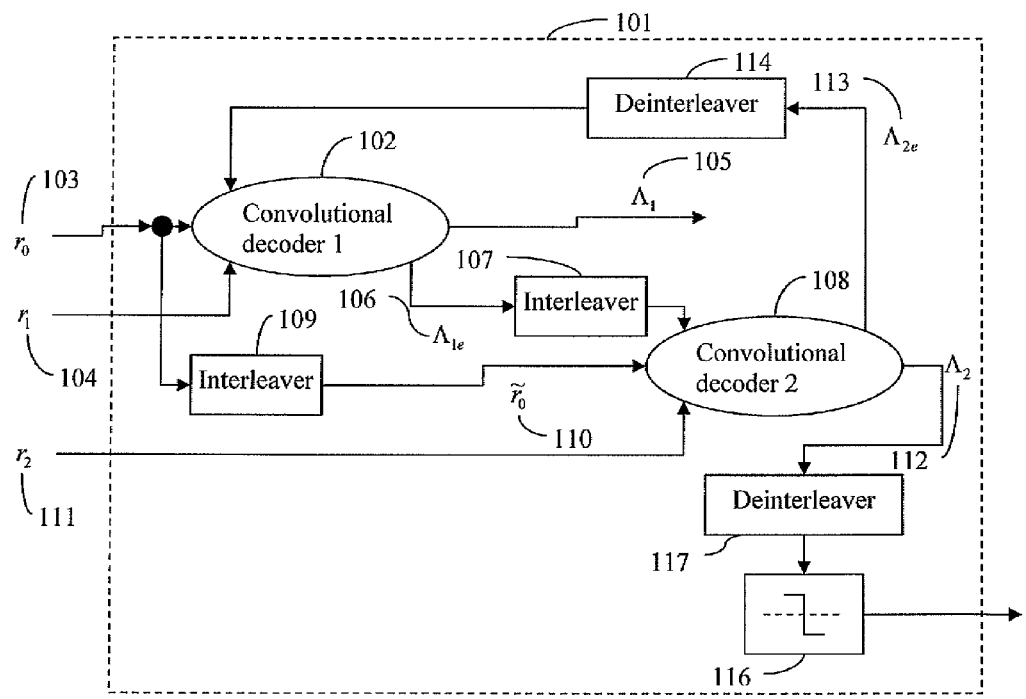
FIG. 1 shows an iterative Turbo decoder in the prior art.

FIG. 1 illustrates an iterative Turbo decoder in the prior art. As shown in FIG. 1, the iterative Turbo decoder 101 consists of two convolutional decoders, i.e. the first convolutional decoder 102 and the second convolutional decoder 108, which are serially concatenated via an interleaver 107. The two convolutional decoders can be, but not limited to, decoders based on the maximum a posteriori probability algorithm or the soft output Viterbi algorithm.

The first convolutional decoder 102 takes as inputs a received systematic bit sequence 103 and a received parity sequence 104 generated by a first convolutional encoder. The first convolutional decoder 102 then produces soft outputs, a first log-likelihood ratio 105 and a first extrinsic information 106. The first extrinsic information 106 is then interleaved in an interleaver 107 and used to produce an improved estimate of the a priori probabilities of the systematic bit sequence for the second convolutional decoder 108.

The second convolutional decoder 108 takes as an input an interleaved systematic bit sequence 110 which is produced by interleaving the received systematic bit sequence 103 in an interleaver 109. The other two inputs to the second convolutional decoder 108 are the interleaved first extrinsic information 106 from the interleaver 107 and a received parity sequence 111 produced by a second convolutional encoder. The second convolutional decoder 108 also produces soft outputs, a second log-likelihood ratio 112 and a second extrinsic information 113. The second extrinsic information 113 is deinterleaved in a deinterleaver 114 and used to improve the estimate of the a priori probabilities for the systematic bit sequence at the input of the first convolutional decoder 102. The initial value of the second extrinsic information 113 from the second convolutional decoder 108 is set to a value corresponding to a priori probability of 50%. The second log-likelihood ratio 112 is deinterleaved in a deinterleaver 117 and then is used to perform hard decision in a second hard decision device 116.

The performance of the iterative Turbo decoder can be improved by an iterative operation where the output of the first convolutional decoder 102 is input to the second convolutional decoder 108, and the output of the second convolutional decoder 108 is input to the first convolutional decoder 102 in the next iteration step.

The outputs of both convolutional decoders 102 and 108 include the log-likelihood ratios (LLRs) 105 and 112 of each systematic bit. Hard decisions on each of these LLRs 105 and 112 correspond to the current best estimate of the systematic bit value. Each hard decision determines the sign of its corresponding LLR value, which in turn determines which binary value was transmitted. Usually in the existing systems the hard decisions from a second convolutional decoder 108 is used. However, in this document, the hard decisions from both convolutional decoders 102 and 108 are used.

Figure 2:
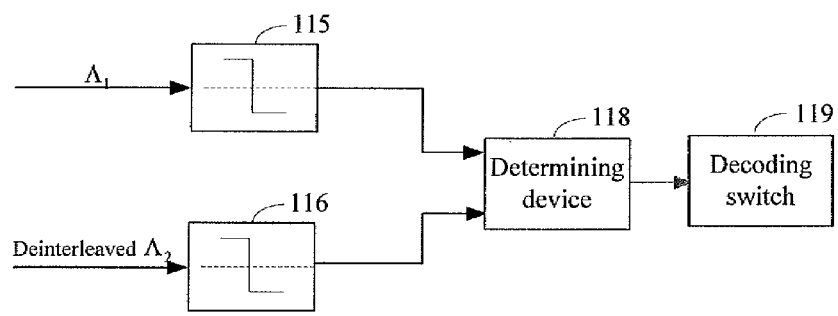
FIG. 2 shows an iterative Turbo decoder according to an embodiment of the present document.

FIG. 2 shows an iterative Turbo decoder according to an embodiment of the present document. In the iterative Turbo decoder shown in FIG. 2, the same components with the iterative Turbo decoder in the prior art shown in FIG. 1 are omitted, i.e. compared with the iterative Turbo decoder in the prior art, the iterative Turbo decoder of the present document further comprises a first hard decision device 115, a determining device 118, and a decoding switch 119. The first hard decision device 115 is configured to perform hard decision on the first log-likelihood ratio 105 and output a first hard decision to a determining device 118. The determining device 118 is configured to determine whether iteration in iterative Turbo decoder should be stopped based on the first and second hard decisions, and output a stopping instruction to the decoding switch when determining that iteration should be stopped. The decoding switch stops the iteration after receiving the stopping instruction. The determination procedure will be discussed in more detail below.

Let H(i, j, k) be the hard decision of the LLR output for the systematic bit number k, where k=1, 2, . . . , N, of the convolutional decoder i, where i=1, 2, and at iteration step j. where j=1, 2, . . . , N is the number of the systematic bits. The convolutional decoder 1 here refers to the first convolutional decoder 102 and the convolutional decoder 2 refers to the second convolutional decoder 108 described above. The possible values of H(i, j, k) belong to the set {−1, 1}.

An alternative to performing the CRC check after every iteration, or to make the CRC check only after a fixed number of iterations, can be used.

Let $$A(j) = \sum_{k=1}^{N} |H(1, j, k) - H(2, j, k)|,$$

where j=1, 2, . . . , $$B(j) = \sum_{k=1}^{N} |H(2, j-1, k) - H(1, j, k)|,$$

where j=2, 3, . . . , $$C(j) = \sum_{k=1}^{N} |H(1, j-1, k) - H(1, j, k)|,$$

where j=2, 3, . . . , $$D(j) = \sum_{k=1}^{N} |H(2, j-1, k) - H(2, j, k)|,$$

where j=2, 3, . . . .

If the hard decisions have not changed for any systematic bit between the first and second convolutional decoding in the same iteration step, then it is likely that the Turbo decoding will not be improved by further iterations. The iteration procedure then should be stopped. That is one stopping criterion is A(j)=0 for any j=1,2, . . . .

If the hard decisions have not changed for any systematic bit between the second and first convolutional decoding in two following iteration steps, then it is likely that the Turbo decoding will not be improved by further iterations. The iteration procedure then should be stopped. That is another stopping criterion is B(j)=0 for any j=2,3, . . . .

If the hard decisions have not changed for any systematic bit between two first convolutional decodings in two following iteration steps, then it is likely that the Turbo decoding will not be improved by further iterations. The iteration procedure then should be stopped. That is still another stopping criterion is C(j)=0 for any j=2,3, . . . .

If the hard decisions have not changed for any systematic bit between two second convolutional decodings in two following iteration steps, then it is likely that the Turbo decoding will not be improved by further iterations. The iteration procedure then should be stopped. That is a further stopping criterion is D(j)=0 for any j=2,3, . . . .

The above four criteria can be used when the iterative decoding will be successful. In that case all of the A, B, C and D will get the value "0" eventually. However, in a case that the iterative decoding will fail, the iterations can go on forever, and a decision that the decoding will not be successful needs to be made as quickly as possible in order to save software and hardware resources. In the latter case, ways to determine when to stop iterating are as follows.

Let a(j)=A(j)−A(j−1), where j=2,3, . . . , b(j)=B(j)−B(j−1), where j=3,4, . . . , c(j)=C(j)−C(j−1), where j=3,4, . . . , d(j)=D(j)−D(j−1), where j=3,4, . . . .

Let x can be any of a, b, c and d. Let $N_x(j=j_0)$ be the number of ascending ordered disjunct connected sets of j:s preceding $j_0$, where the x value for the last element in each such set is strictly negative and the corresponding x:s of the preceding elements of the set are zero or positive and includes at least one strictly positive value. For the first j in ascending order where x(j)>0 and $N_x(j)=M_x$ for any x=a,b,c,d, then stop iterating. The $M_x$, where x=a, b, c, d, can be chosen as any value among 0, 1, 2, . . . , 9.

The determining device 118 determines whether iteration should be stopped based on the above stopping criteria.

In all above stopping criteria, the stopping of the iterations means that the Turbo decoding stops immediately. This implies that for the stopping criteria based on B, C, b and c iteration stops after the first convolutional decoder and before the second convolutional decoder within one Turbo decoding iteration. For the criteria A, D, a and d iteration stops after the second convolutional decoder within one Turbo decoding iteration.

Here follows an embodiment of the method for stopping iteration in an iterative Turbo decoder according to the present document.

Figure 3:
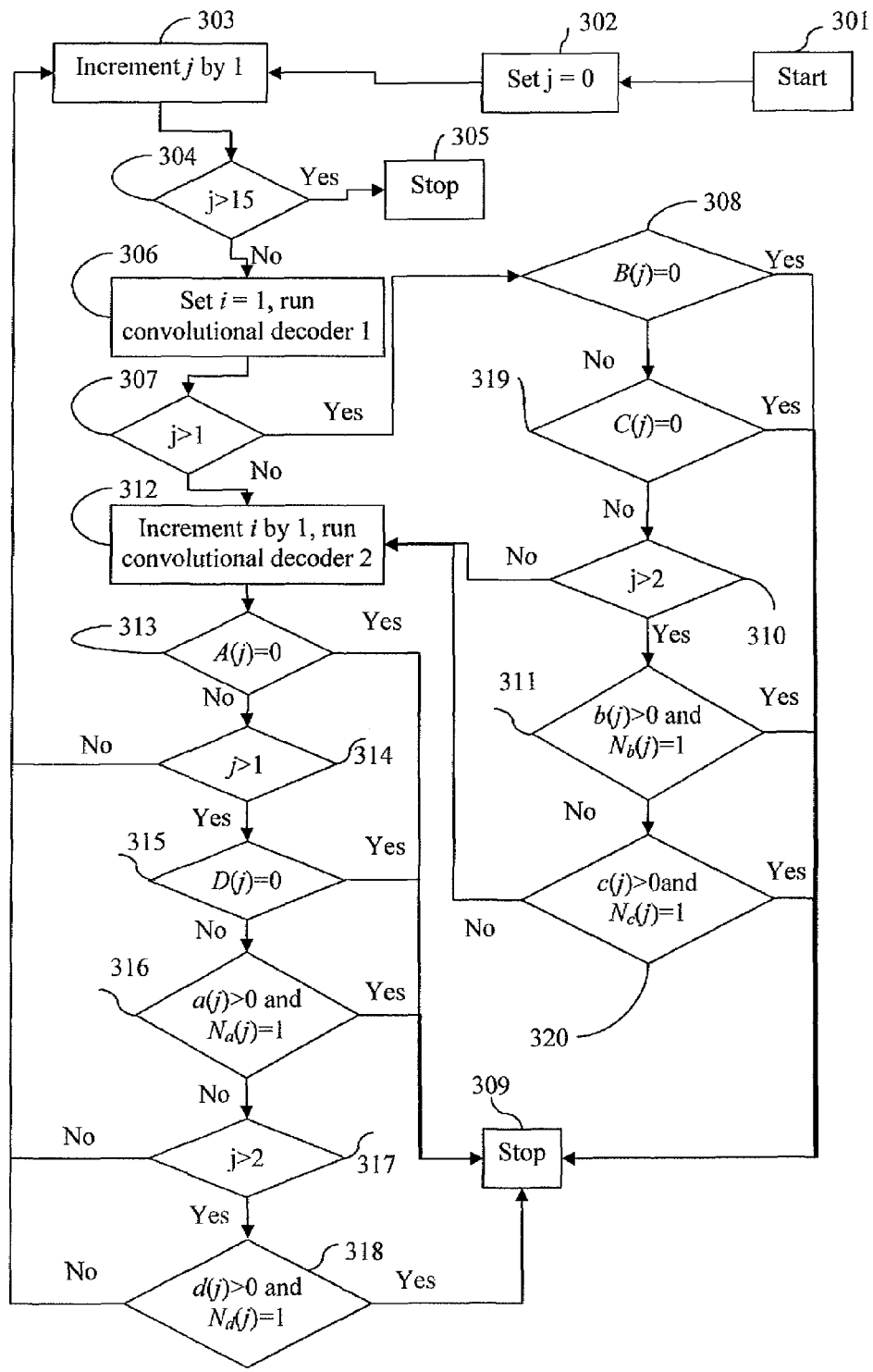
FIG. 3 shows the flow of the method for stopping iteration in the iterative Turbo decoder according to an embodiment of the present document.

In this embodiment, the method is implemented in a mobile terminal for decoding of HS-PDSCH in a WCDMA system. FIG. 3 shows the procedure of the method for stopping iteration in the iterative Turbo decoder illustrated in FIG. 2. Part from the stopping criteria of the document, the decoder also has a stopping criterion, that is, the maximum number of iterations equals to 15. $M_x$=1, where x=a, b, c, d.

The stopping procedure is started at step 301 by initiating the first Turbo decoding iteration counter to zero at step 302. At the first iteration, the iteration counter j is increased by 1 firstly at step 303. The first Turbo decoding iteration counter is checked if it is larger than the maximum number of iterations at step 304. If it is, then the iteration procedure stops at step 305. If it is not, then the convolutional decoder number i is set to 1 and the first convolutional decoder is run at step 306.

If the number of iterations j is larger than 1 at step 307, then if B(j)=0 at step 308, the iteration procedure stops at step 309. Otherwise, if the C(j)=0 at step 319, the iteration procedure stops at step 309. Otherwise, if the number of iterations j is less or equal to 2 at step 310, then the stopping procedure continues at step 312. Otherwise if b(j)>0 and $N_b(j)$=1 at step 311, then the iteration procedure stops at step 309. Otherwise, if c(j)>0 and $N_c(j)$=1 at step 320, the iteration procedure stops at step 309. Otherwise, the stopping procedure continues at step 312. Wherein, the determining procedures of B(j) and C(j) can exchange with each other in sequence, and the determining procedures of b(j) and c(j) can also exchange with each other in sequence. At step 312 the convolutional decoder number i is incremented by 1 and the second convolutional decoder is run.

Then if A(j)=0 at step 313, the iteration procedure stops at step 309. Otherwise, if the number of iterations j is not larger than 1 at step 314, then the procedure goes to step 303 and the iteration counter is increased by 1 at step 303. Otherwise, if j>1 at step 314, the procedure goes to step 315. If D(j)=0 at step 315, the iteration procedure stops at step 309. Otherwise, if D(j)≠0 at step 315, then the procedure goes to step 316. If a(j)>0 and $N_a(j)$=1 at step 316, then the iteration procedure stops at step 309. Otherwise, if a(j)≤0 or $N_a(j)$≠1, then the procedure goes to step 317. Wherein the determining procedures of D(j) and a(j) can exchange with each other in sequence.

If the number of iterations j is not larger than 2 at step 317, then the procedure goes to step 303 and the iteration counter is increased by 1 at step 303. Otherwise, if j>2 at step 317, then the procedure goes to step 318. If d(j)>0 and $N_d(j)$=1 at step 318, then the iteration procedure stops at step 309. Otherwise, if d(j)≤0 or $N_d(j)$≠1, then the procedure goes to step 303 and the iteration counter j is increased by 1 at step 303. The iterative procedure continues until any of the stopping criteria are satisfied.

Figure 4:
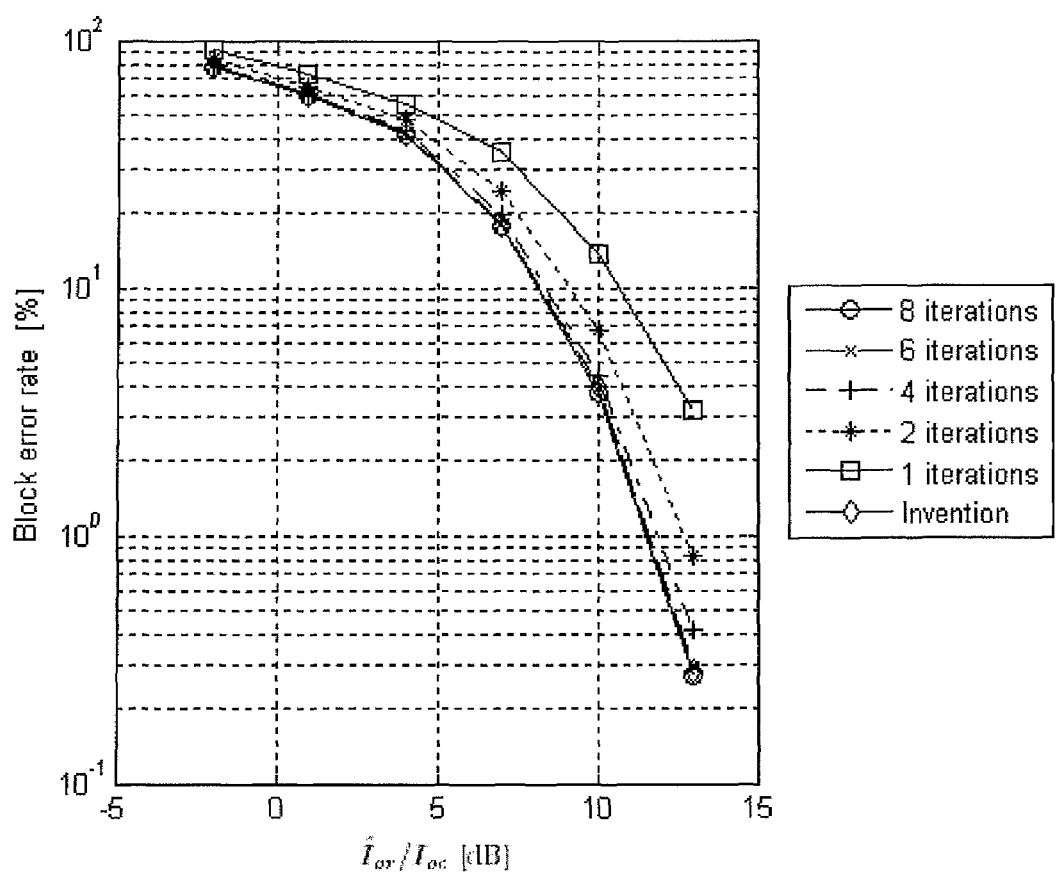
FIG. 4 shows the simulated results by using the fixed number iterations solutions and the solution according to the present document.
Figure 5:
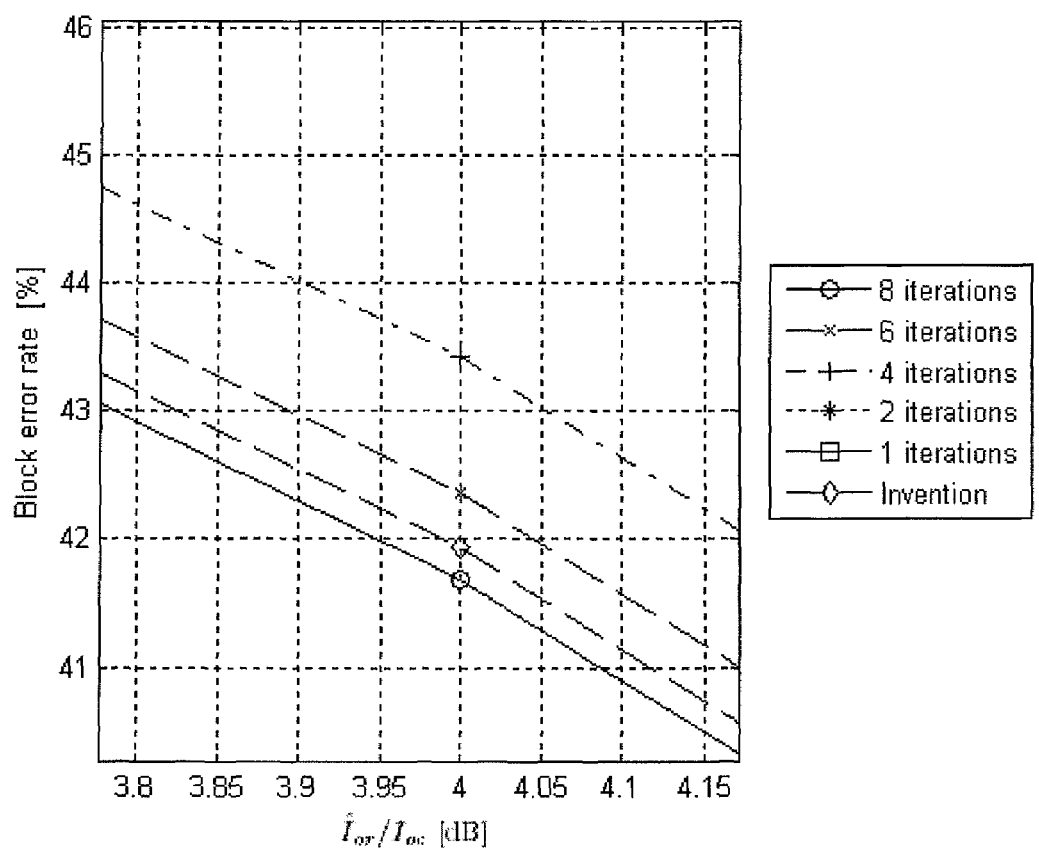
FIG. 5 shows the simulated results by using the fixed number iterations solutions and the solution according to the present document.
Figure 6:
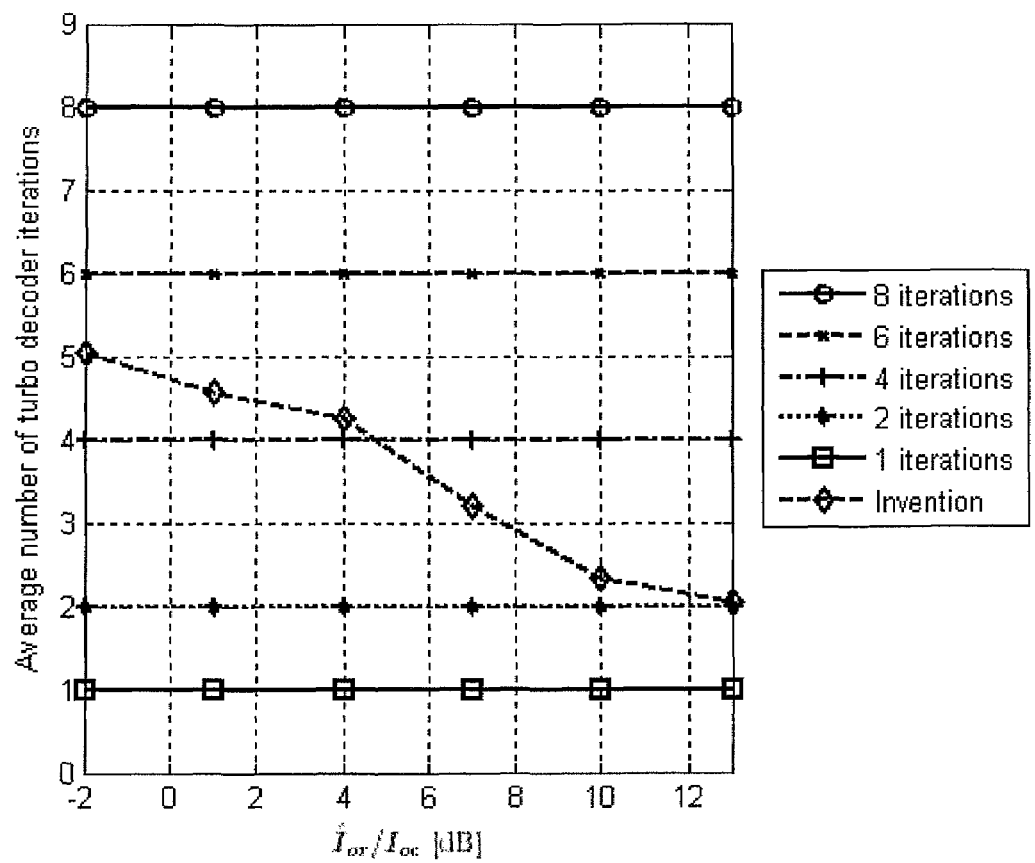
FIG. 6 shows the simulated results by using the fixed number iterations solutions and the solution according to the present document.

In FIG. 4 to FIG. 6, simulated results of downlink performance test cases are presented. The simulations were done using the 3GPP PB3 radio environment simulation model, as can be understand that other simulation model may also be used. The different curves represent different Turbo decoder solutions. In FIG. 4 to FIG. 6, five curves, or five solutions use five fixed numbers of iterations, more specifically 8, 6, 4, 2 and 1 iterations, and with one final CRC check. Here one iteration corresponds to one run of the convolutional decoder 1 followed by one run of the convolutional decoder 2. These five solutions are labeled 8 iterations, 6 iterations, 4 iterations, 2 iterations and 1 iteration, respectively. The example solution of the present document is labeled Document. It is noted that in the solution according to the present document, $M_x=1$, where x=a,d. Hence, in this example the stopping criteria according to B, C, b, c, $M_b$ and $M_c$ are omitted. In the simulations, log MAP decoders were used as convolutional decoders.

In FIG. 4, the performance in terms of block error rate v/s $\hat{I}_{or}/I_{oc}$ is presented for the different solutions, where $I_{oc}$ is the power spectral density (integrated in a noise bandwidth equal to the chip rate and normalized to the chip rate) of a band limited white noise source (simulating interference from cells, which are not defined in a test procedure) as measured at the UE antenna connector, and $\hat{I}_{or}$ is the received power spectral density (integrated in a bandwidth of (1+α) times the chip rate and normalized to the chip rate) of the downlink signal as measured at the UE antenna connector, where a is the root raised cosine filter roll-off factor. The performance of the method according to the present document is in the order of the 8 fixed iterations solution. In FIG. 5, the performance in terms of block error rate v/s $\hat{I}_{or}/I_{oc}$ is also presented for the different solutions. And FIG. 5 shows a closer look of FIG. 4. In FIG. 6, the average number of Turbo decoder iterations v/s $\hat{I}_{or}/I_{oc}$ is presented for the different solutions. This figure shows that the average number of iterations by using the solution according to the present document is substantially reduced compared to the 8 fixed iterations solution.

From FIG. 4 to FIG. 6, it can be seen that the solution according to the present document can achieve the performance similar to the 8 fixed iterations solution, but with much less iterations than 8 iterations in average.

While embodiment of the document have been illustrated and described, it is not intended that these embodiments illustrate and describe all possible forms of the document. Rather, the words used in the specification are words of description rather than limitation, and it is understood that various changes and modifications may be made without departing from the spirit and scope of the document.

INDUSTRIAL APPLICABILITY

By implementing the stopping criteria for the iterative turbo decoder of this document, the complexity of the hardware resources in the base station or mobile can be reduced. This reduction in complexity could relax the requirements on the hardware resource capabilities, which could lead to the possibility to use simpler and therefore, maybe cheaper hardware solutions. Alternatively, for a given hardware solution, the reduced utilization of the hardware resource could lead to the possibility to fill the freed resource with other functionality, which could in other ways improve the overall system performance.

The invention claimed is:

1. A method for stopping iteration in an iterative Turbo decoder comprising:

obtaining a first hard decision H(1, j, k) and a second hard decision H(2, j, k) for systematic bit number k at iteration step j=1;

wherein k=1, 2, ..., N, and N is the number of systematic bits;

wherein H(1, j, k) is obtained by performing hard decision on a first log-likelihood ratio output from a first convolutional decoder of the iterative Turbo decoder for systematic bit number k at iteration step j=1, and H(2, j, k) is obtained by performing hard decision on a deinterleaved second log-likelihood ratio for systematic bit number k at iteration step j=1, the deinterleaved second log-likelihood ratio is obtained by deinterleaving a second log-likelihood ratio output from a second convolutional decoder of the iterative Turbo decoder;

determining whether A(j) is zero at j=1, wherein A(j) is calculated by:

$$A(j) = \sum_{k=1}^{N} |H(1, j, k) - H(2, j, k)|,$$

where j=1; and stopping the iteration if A(j) is zero at j=1;

wherein in the determining step of A(j) at j=1, when A(j) is nonzero at j=1, the method further comprises:

obtaining a first hard decision H(1, j, k) and a second hard decision H(2, j, k) for systematic bit number k at iteration step j, wherein j=2, 3, ...;

wherein H(1, j, k) is obtained by performing hard decision on a first log-likelihood ratio output from the first convolutional decoder of the iterative Turbo decoder for systematic bit number k at iteration step j, and H(2, j, k) is obtained by performing hard decision on a deinterleaved second log-likelihood ratio for systematic bit number k at iteration step j, the deinterleaved second log-likelihood ratio is obtained by deinterleaving a second log-likelihood ratio output from the second convolutional decoder of the iterative Turbo decoder;

determining whether B(j) or C(j) is zero at j>1, wherein B(j) is calculated by:

$$B(j) = \sum_{k=1}^{N} |H(2, j-1, k) - H(1, j, k)|,$$

where j=2, 3, ..., wherein C(j) is calculated by:

$$C(j) = \sum_{k=1}^{N} |H(1, j-1, k) - H(1, j, k)|,$$

where j=2, 3, ..., and stopping the iteration when B(j) or C(j) is zero.

2. The method of claim 1, wherein in the determining step of B(j) and C(j) at j>1, when both B(j) and C(j) are nonzero at j>1, the method further comprises:

determining whether A(j) or D(j) is zero at j>1, and whether a(j)>0 and $N_a(j)=M_a$ at j>1, wherein A(j) is calculated by:

$$A(j) = \sum_{k=1}^{N} |H(1, j, k) - H(2, j, k)|,$$

where j=2, 3, . . . ,
wherein D(j) is calculated by:

$$D(j) = \sum_{k=1}^{N} |H(2, j-1, k) - H(2, j, k)|,$$

where j=2, 3, . . . ,
   wherein a(j) is calculated by: a(j)=A(j)−A(j−1), where j=2, 3, . . . ,
   wherein $M_a$ is any one among 0, 1, 2, . . . , 9;
   wherein $N_a(j)$ is the number of ascending ordered disjunct connected sets of j:s preceding j, where a(j) for the last element in each set is negative, and a(j) for the preceding elements of the set are zero or positive and includes at least one positive value;
stopping the iteration if A(j) or D(j) is zero; and
stopping the iteration if a(j)>0 and $N_a(j)=M_a$.

3. The method of claim 1, wherein in the step of determining whether A(j) or D(j) is zero at j>1, or a(j)>0 and $N_a(j)=M_a$ at j>1, if both A(j) and D(j) are nonzero at j>1 and a(j)≤0 or $N_a(j) \neq M_a$ at j>1, the method further comprising:
   determining whether b(j)>0 and $N_b(j)=M_b$ at j>2 or c(j)>0 and $N_c(j)=M_c$ at j>2,
      wherein b(j) is calculated by: b(j)=B(j)−B(j−1), where j=3, 4, . . . ;
      wherein $M_b$ is any one among 0, 1, 2, . . . , 9;
      wherein $N_b(j)$ is the number of ascending ordered disjunct connected sets of j:s preceding j, where b(j) for the last element in each set is negative, and b(j) for the preceding elements of the set are zero or positive and includes at least one positive value;
      wherein c(j) is calculated by: c(j)=C(j)−C(j−1), where j=3, 4, . . . ;
      wherein $M_c$ is any one among 0, 1, 2, . . . , 9;
      wherein $N_c(j)$ is the number of ascending ordered disjunct connected sets of j:s preceding j, where c(j) for the last element in each set is negative, and c(j) for the preceding elements of the set are zero or positive and includes at least one positive value;
   and
   stopping the iteration if b(j)>0 and $N_b(j)=M_b$, or c(j)>0 and $N_c(j)=M_c$.

4. The method of claim 3, wherein in the step of determining whether b(j)>0 and $N_b(j)=M_b$ at j>2 or c(j)>0 and $N_c(j)=M_c$ at j>2, if b(j)≤0 or $N_b(j) \neq M_b$, and c(j)≤0 or $N_c(j) \neq M_c$, the method further comprising:
   determining whether A(j) or D(j) is zero at j>2, or a(j)>0 and $N_a(j)=M_a$ at j>2, or d(j)>0 and $N_d(j)=M_d$ at j>2
      wherein A(j) is calculated by:

$$A(j) = \sum_{k=1}^{N} |H(1, j, k) - H(2, j, k)|,$$

where j=3, 4, . . . ,
   wherein D(j) is calculated by:

$$D(j) = \sum_{k=1}^{N} |H(2, j-1, k) - H(2, j, k)|,$$

where j=3, 4, . . . ,
   wherein a(j) is calculated by: a(j)=A(j)−A(j−1), where j=3, 4, . . . ;
   wherein $M_a$ is any one among 0, 1, 2, . . . , 9;
   wherein $N_a(j)$ is the number of ascending ordered disjunct connected sets of j:s preceding j, where a(j) for the last element in each set is negative, and a(j) for the preceding elements of the set are zero or positive and includes at least one positive value;
   wherein d(j) is calculated by: d(j)=D(j)−D(j−1), where j=3, 4, . . . ;
   wherein $M_d$ is any one among 0, 1, 2, . . . , 9;
   wherein $N_d(j)$ is the number of ascending ordered disjunct connected sets of j:s preceding j, where d(j) for the last element in each set is negative, and d(j) for the preceding elements of the set are zero or positive and includes at least one positive value;
and
stopping the iteration if A(j) or D(j) is zero, or a(j)>0 and $N_a(j)=M_a$, or d(j)>0 and $N_d(j)=M_d$.

5. The method of claim 1, wherein the iteration step j has a maximum number of $j_0$, if the iteration is not stopped at j<$j_0$, the method further comprising:
   stopping the iteration at j=$j_0$.

6. An iterative Turbo decoder comprising:
   a first hard decision device, the first hard decision device being configured to perform hard decision on a first log-likelihood ratio output from a first convolutional decoder and output a first hard decision H(1, j, k) for systematic bit number k at iteration step j; wherein k=1, 2, . . . , N, and N is the number of systematic bits, and j=1, 2, . . . ;
   a determining device, the determining device being configured to determine when to stop iteration in the iterative Turbo decoder based on the first hard decision H(1, j, k) and a second hard decision H(2, j, k), and output a stopping instruction to a decoding switch when determining a stopping criterion is met; and
   the decoding switch, the decoding switch being configured to stop iteration when receiving the stopping instruction from the determining device;
   wherein the second hard decision H(2, j, k) is output from a second hard decision device, the second hard decision device is configured to perform hard decision on a deinterleaved second log-likelihood ratio, the deinterleaved second log-likelihood ratio is obtained by deinterleaving a second log-likelihood ratio output from a second convolutional decoder,
   wherein the first convolutional decoder outputs a first extrinsic information that is then interleaved and output to the second convolutional decoder;
   wherein the determining device is configured to determine whether A(j) is zero at j=1, and outputs the stopping instruction to the decoding switch when determining that A(j) is zero at j=1, wherein A(j) is calculated by:

$$A(j) = \sum_{k=1}^{N} |H(1, j, k) - H(2, j, k)|,$$

where j=1;
wherein, the determining device is further configured to determine whether B(j) or C(j) is zero at j>1 when A(j) is nonzero at j=1, and output the stopping instruction to the decoding switch when determining that B(j) or C(j) is zero at j>1,
wherein B(j) is calculated by:

$$B(j) = \sum_{k=1}^{N} |H(2, j-1, k) - H(1, j, k)|,$$

where j=2, 3, . . . ,
wherein C(j) is calculated by:

$$C(j) = \sum_{k=1}^{N} |H(1, j-1, k) - H(1, j, k)|,$$

where j=2, 3, . . . , ;
wherein, the determining device is further configured to determine whether A(j) or D(j) is zero at j>1 and whether a(j)>0 and $N_a(j)=M_a$ at j>1 when both B(j) and C(j) are nonzero at j>1, output the stopping instruction to the decoding switch when determining A(j) or D(j) is zero, and output the stopping instruction to the decoding switch when determining a(j)>0 and $N_a(j)=M_a$,
wherein A(j) is calculated by:

$$A(j) = \sum_{k=1}^{N} |H(1, j, k) - H(2, j, k)|,$$

where j=2, 3, . . . ,
wherein D(j) is calculated by:

$$D(j) = \sum_{k=1}^{N} |H(2, j-1, k) - H(2, j, k)|,$$

where j=2, 3, . . . ,
wherein a(j) is calculated by: a(j)=A(j)−A(j−1), where j=2, 3, . . . ,
wherein $M_a$ is any one among 0, 1, 2, . . . , 9;
wherein $N_a(j)$ is the number of ascending ordered disjunct connected sets of j:s preceding j, where a(j) for the last element in each set is negative, and a(j) for the preceding elements of the set are zero or positive and includes at least one positive value.

7. The iterative Turbo decoder of claim 6, wherein
the determining device is further configured to determine whether b(j)>0 and $N_b(j)=M_b$ at j>2 or c(j)>0 and $N_c(j)=M_c$ at j>2 if both A(j) and D(j) are nonzero at j>1 and a(j)≤0 or $N_a(j) \ne M_a$ at j>1, and output the stopping instruction to the decoding switch when determining b(j)>0 and $N_b(j)=M_b$, or c(j)>0 and $N_c(j)=M_c$;
wherein b(j) is calculated by: b(j)=B(j)−B(j−1), where j=3, 4, . . . ;
wherein $M_b$ is any one among 0, 1, 2, . . . , 9;
wherein $N_b(j)$ is the number of ascending ordered disjunct connected sets of j:s preceding j, where b(j) for the last element in each set is negative, and b(j) for the preceding elements of the set are zero or positive and includes at least one positive value;
wherein c(j) is calculated by: c(j)=C(j)−C(j−1), where j=3, 4, . . . ;
wherein $M_c$ is any one among 0, 1, 2, . . . , 9;
wherein $N_c(j)$ is the number of ascending ordered disjunct connected sets of j:s preceding j, where c(j) for the last element in each set is negative, and c(j) for the preceding elements of the set are zero or positive and includes at least one positive value.

8. The iterative Turbo decoder of claim 7, wherein
the determining device is further configured to determine whether A(j) or D(j) is zero at j>2, or a(j)>0 and $N_a(j)=M_a$ at j>2, or d(j)>0 and $N_d(j)=M_d$ at j>2 if b(j)≤0 or $N_b(j) \ne M_b$, and c(j)≤0 or $N_c(j) \ne M_c$, and output the stopping instruction to the decoding switch when determining A(j) or D(j) is zero, or a(j)>0 and $N_a(j)=M_a$, or d(j)>0 and $N_d(j)=M_d$;
wherein A(j) is calculated by:

$$A(j) = \sum_{k=1}^{N} |H(1, j, k) - H(2, j, k)|,$$

where j=3, 4, . . . ,
wherein D(j) is calculated by:

$$D(j) = \sum_{k=1}^{N} |H(2, j-1, k) - H(2, j, k)|,$$

where j=3, 4, . . . ,
wherein a(j) is calculated by: a(j)=A(j)−A(j−1), where j=3, 4, . . . ;
wherein $M_a$ is any one among 0, 1, 2, . . . , 9;
wherein $N_a(j)$ is the number of ascending ordered disjunct connected sets of j:s preceding j, where a(j) for the last element in each set is negative, and a(j) for the preceding elements of the set are zero or positive and includes at least one positive value;
wherein d(j) is calculated by: d(j)=D(j)−D(j−1), where j=3, 4, . . . ;
wherein $M_d$ is any one among 0, 1, 2, . . . , 9;
wherein $N_d(j)$ is the number of ascending ordered disjunct connected sets of j:s preceding j, where d(j) for the last element in each set is negative, and d(j) for the preceding elements of the set are zero or positive and includes at least one positive value.

9. The iterative Turbo decoder of claim 6, wherein the iteration step j has a maximum number of $j_O$, the determining device is further configured to output the stopping instruction to the decoding switch at j=$j_O$.

10. The method of claim 3, wherein the iteration step j has a maximum number of $j_O$, if the iteration is not stopped at j<$j_O$, the method further comprising:
stopping the iteration at j=$j_O$.

11. The method of claim 4, wherein the iteration step j has a maximum number of $j_O$, if the iteration is not stopped at j<$j_O$, the method further comprising:
stopping the iteration at j=$j_O$.

12. The iterative Turbo decoder of claim 6, wherein the iteration step j has a maximum number of $j_O$, the determining device is further configured to output the stopping instruction to the decoding switch at j=$j_O$.

13. The iterative Turbo decoder of claim 7, wherein the iteration step j has a maximum number of $j_0$, the determining device is further configured to output the stopping instruction to the decoding switch at $j=j_0$.

* * * * *